(12) United States Patent
Cheng et al.

(10) Patent No.: US 8,919,974 B2
(45) Date of Patent: Dec. 30, 2014

(54) MULTI-REFLECTION STRUCTURE AND PHOTO-ELECTRIC DEVICE

(75) Inventors: Tsung-Dar Cheng, Taipei (TW); Jen-You Chu, Hsinchu (TW); Ding-Zheng Lin, Taipei (TW); Yi-Ping Chen, Kaohsiung (TW); Jia-Han Li, Kaohsiung (TW); Hsin-Hung Cheng, New Taipei (TW); Ying-Yu Chang, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 358 days.

(21) Appl. No.: 13/275,317

(22) Filed: Oct. 18, 2011

(65) Prior Publication Data

US 2013/0003204 A1  Jan. 3, 2013

(30) Foreign Application Priority Data

Jun. 29, 2011  (TW) .............................. 100122891 A (51) Int. Cl.
*G02B 5/08* (2006.01)
*G02B 19/00* (2006.01)
*H01L 31/052* (2014.01)
*H01L 31/0236* (2006.01)

(52) U.S. Cl.
CPC ........ *G02B 19/0042* (2013.01); *G02B 19/0028* (2013.01); *H01L 31/0522* (2013.01); *H01L 31/02363* (2013.01); *H01L 31/02366* (2013.01); *G02B 19/0061* (2013.01); *Y02E 10/52* (2013.01)
USPC ............ 359/850; 359/530; 359/546; 359/855

(58) Field of Classification Search
CPC ........ G02B 5/0808; G02B 5/09; G02B 5/122; G02B 5/124; G02B 5/136
USPC .................. 359/850, 855, 856, 529, 530, 546
See application file for complete search history.

(56) References Cited

U.S. PATENT DOCUMENTS

| 4,268,347 A | 5/1981 | Stephens |
| 5,080,725 A | 1/1992 | Green et al. |

(Continued)

FOREIGN PATENT DOCUMENTS

| CN | 1504809 | 6/2004 |
| CN | 1573365 | 2/2005 |

(Continued)

OTHER PUBLICATIONS

Smith et al., "A new texturing geometry for producing high efficiency solar cells with no antireflection coatings", Solar Energy Materials and Solar Cells, vol. 29, Feb. 1993, 51-65.

(Continued)

*Primary Examiner* — Frank Font
(74) *Attorney, Agent, or Firm* — Jianq Chyun IP Office (57) ABSTRACT

A multi-reflection structure including a substrate and pyramid is provided. The substrate includes an inversed pyramid shaped recess having at least three first reflection sidewalls. The pyramid is disposed on the substrate and located in the inversed pyramid shaped recess. The pyramid has at least three second reflection sidewalls, wherein the normal of each of the second reflection sidewalls and the normal of each of the first reflection sidewalls are not located in the same plane. Furthermore, a photo-electric device is also provided in the present application.

17 Claims, 7 Drawing Sheets

(56) References Cited

U.S. PATENT DOCUMENTS

| | | | |
|---|---|---|---|
| 5,081,049 A | 1/1992 | Green et al. | |
| 5,820,957 A | 10/1998 | Schroeder et al. | |
| 5,961,742 A | 10/1999 | Tange et al. | |
| 6,084,175 A | 7/2000 | Perry et al. | |
| 6,091,021 A | 7/2000 | Ruby et al. | |
| 6,127,623 A | 10/2000 | Nakamura et al. | |
| 6,147,297 A | 11/2000 | Wettling et al. | |
| 6,329,296 B1 | 12/2001 | Ruby et al. | |
| 7,368,655 B2 | 5/2008 | Blieske et al. | |
| 7,922,358 B2 * | 4/2011 | von Malm | 362/293 |
| 8,124,217 B2 * | 2/2012 | Phillips et al. | 428/172 |
| 8,714,757 B1 * | 5/2014 | Smith | 359/530 |
| 8,728,610 B2 * | 5/2014 | Benson et al. | 428/167 |
| 2007/0211346 A1 | 9/2007 | Noguchi et al. | |
| 2009/0071536 A1 | 3/2009 | Chan et al. | |
| 2009/0273735 A1 | 11/2009 | Yeh | |
| 2010/0149510 A1 | 6/2010 | Zaczek et al. | |
| 2014/0198386 A1 * | 7/2014 | Smith | 359/530 |

FOREIGN PATENT DOCUMENTS

| | | |
|---|---|---|
| CN | 1826541 | 8/2006 |
| CN | 1961224 | 5/2007 |
| CN | 101198889 | 6/2008 |
| CN | 101273231 | 9/2008 |
| CN | 101373234 A | 2/2009 |
| CN | 101894870 | 11/2010 |
| CN | 201795425 U | 4/2011 |
| TW | M354858 | 4/2009 |
| TW | 200946976 | 11/2009 |
| TW | 200952168 | 12/2009 |
| TW | 201041162 | 11/2010 |
| TW | 201044614 | 12/2010 |

OTHER PUBLICATIONS

Smith et al., "Ray tracing analysis of the inverted pyramid texturing geometry for high efficiency silicon solar cells", Solar Energy Materials and Solar Cells, vol. 29, Feb. 1993, 37-49.

Zhao et al., "19.8% efficient "honeycomb" textured multicrystalline and 24.4% monocrystalline silicon solar cells", Applied Physics Letters, vol. 73, No. 14, Oct. 5, 1998, 1991-1993.

Zhao et al., "24% Efficient perl silicon solar cell: Recent improvements in high efficiency silicon cell research", Solar Energy Materials and Solar Cells, vol. 41-42, Jun. 1996, 87-99.

"Office Action of Taiwan Counterpart Application", issued on Dec. 23, 2013, p. 1-p. 4.

"First Office Action of China Counterpart Application, CN 101273231", issued on Apr. 2, 2014, p. 1-p. 12.

"Office Action of China Counterpart Application", issued on Oct. 10, 2014, pp. 1-6.

* cited by examiner

MULTI-REFLECTION STRUCTURE AND PHOTO-ELECTRIC DEVICE

CROSS-REFERENCE TO RELATED APPLICATION

This application claims the priority benefit of Taiwan application serial no. 100122891, filed on Jun. 29, 2011. The entirety of the above-mentioned patent application is hereby incorporated by reference herein and made a part of this specification.

BACKGROUND OF THE INVENTION

1. Field of the Application

The present application relates to a multi-reflection structure and a photo-electric device. More particularly, the present application relates to a multi-reflection structure that reduces surface reflection and a photo-electric device having the same.

2. Description of Related Art

Recently, photo-electric industries (display industry, solid-state illumination device industry, solar cell industry, and so on) grow rapidly and continuously change living habits of human beings. However, during research and development of the aforesaid photo-electric industries, surface reflection issue resulted from difference of refractive indices is inevitable. In displays, overall brightness thereof is reduced by surface reflection. In solid-state illumination devices (e.g. light-emitting diodes or organic electro-luminescent devices), illumination performance thereof is reduced by surface reflection. According to some researches, in organic electro-luminescent devices, about 70% to 80% optical loss is resulted from surface reflection.

Similarly, in the solar cells, photoelectric conversion efficiency thereof is reduced by surface reflection also. Specifically, solar cells are kinds of photo-electric devices that convert light into electric power. The photoelectric conversion efficiency of solar cells is related to photo current and voltage generated therefrom. In order to increase photo current of solar cells, light absorption of solar cells is required to be increased. Since the conventional mono-crystalline silicon solar cells have sufficient thickness, light absorption of mono-crystalline silicon solar cells is not a problem. Accordingly, it is imperative to reduce optical loss resulted from surface reflection of mono-crystalline silicon solar cells.

According to the Fresnel's Law, when light propagates through an interface of two mediums having different refractive indices, reflectivity of the propagated light is proportional to difference of refractive indices. Specifically, the smaller the difference of the refractive indices of the two mediums is, the lower the reflectivity of the propagated light can be obtained. On the contrary, the greater the difference of the refractive indices of the two mediums is, the higher the reflectivity of the propagated light can be obtained. Take silicon substrates that are often used in semiconductor devices as an example, refractive index thereof is about 3 to 4. When light propagates the interface of air and the silicon substrate having a flat surface, reflectivity of the propagated light is considerably high (e.g. reflectivity is about 36%).

In the conventional solar cells, a hydrogen containing amorphous silicon nitride serving as an anti-reflection coating is suggested to be formed on the solar cells to reduce surface reflection issue and enhance photoelectric conversion efficiency of solar cells. However, the anti-reflection coating cannot significantly enhance photoelectric conversion efficiency of solar cells. According, some prior arts (e.g. U.S. Pat. No. 5,081,049, U.S. Pat. No. 5,080,725, US 2009/071536, TWM 354858, U.S. Pat. No. 7,368,655) have proposed. In the aforesaid prior arts, Optical micro-structures are suggested to be formed on a light-incident surface of solar cells, such that light incident from the light-incident surface of solar cells can be reflected twice and optical loss resulted from surface reflection can be reduced. However, in the aforesaid prior arts (e.g. U.S. Pat. No. 5,081,049, U.S. Pat. No. 5,080,725, US 2009/071536, TWM 354858, U.S. Pat. No. 7,368,655), since almost light is reflected by the optical micro-structures twice, optical loss resulted from surface reflection cannot be reduced significantly.

As such, it is imperative to further reduce optical loss resulted from surface reflection.

SUMMARY OF THE INVENTION

The present application provides a multi-reflection structure and a photo-electric device having favorable optical performance.

The present application provides a multi-reflection structure comprising a substrate and a pyramid. The substrate comprises an inversed pyramid shaped recess having at least three first reflection sidewalls. The pyramid is disposed on the substrate and is located in the inversed pyramid shaped recess. The pyramid has at least three second reflection sidewalls, wherein a normal of each of the second reflection sidewalls and a normal of each of the first reflection sidewalls are not located in the same plane.

The present application provides a multi-reflection structure comprising a substrate at least one first pyramid and at least one second pyramid. The first pyramid is disposed on the substrate and has at least three first reflection sidewalls. The second pyramid is disposed on the substrate and has at least three second reflection sidewalls, wherein a normal of each of the second reflection sidewalls and a normal of each of the first reflection sidewalls are not located in the same plane.

The present application provides a photo-electric device comprising a photoelectric conversion layer and a plurality of electrodes. The photoelectric conversion layer comprises a plurality of inversed pyramid shaped recesses and a plurality of a pyramids, wherein each of the inversed pyramid shaped recesses has at least three first reflection sidewalls, each of the pyramids is located in one of the inversed pyramid shaped recesses respectively, each of the pyramids has at least three second reflection sidewalls, and a normal of each of the second reflection sidewalls and a normal of each of the first reflection sidewalls are not located in the same plane. Furthermore, the electrodes are electrically connected to the photoelectric conversion layer.

In order to the make the aforementioned and other objects, features and advantages of the present application comprehensible, several embodiments accompanied with figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

First Embodiment

Figure 1A:
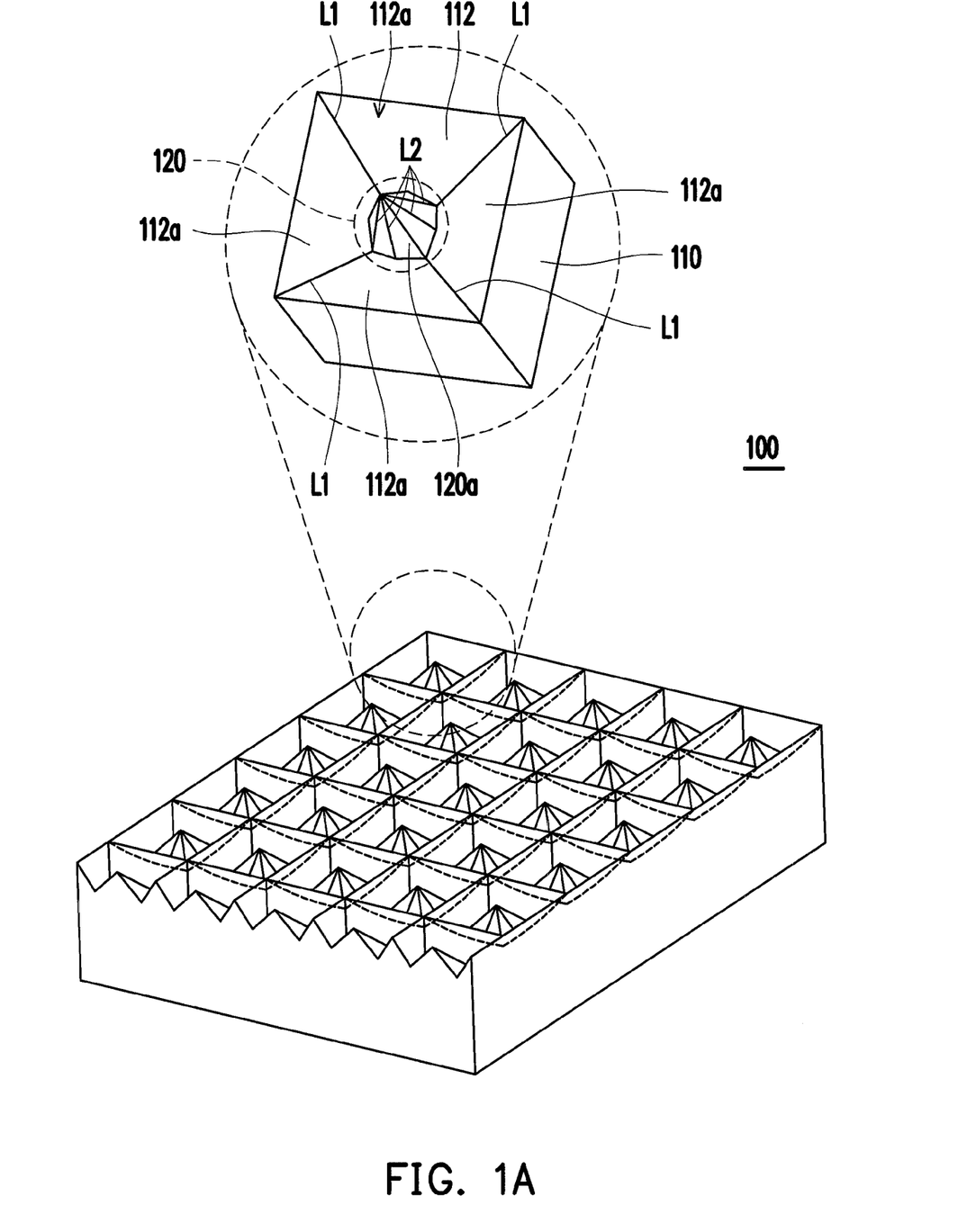
FIG. 1A is a perspective view of a multiple-reflection structure according to the first embodiment of the present application.
Figure 1B:
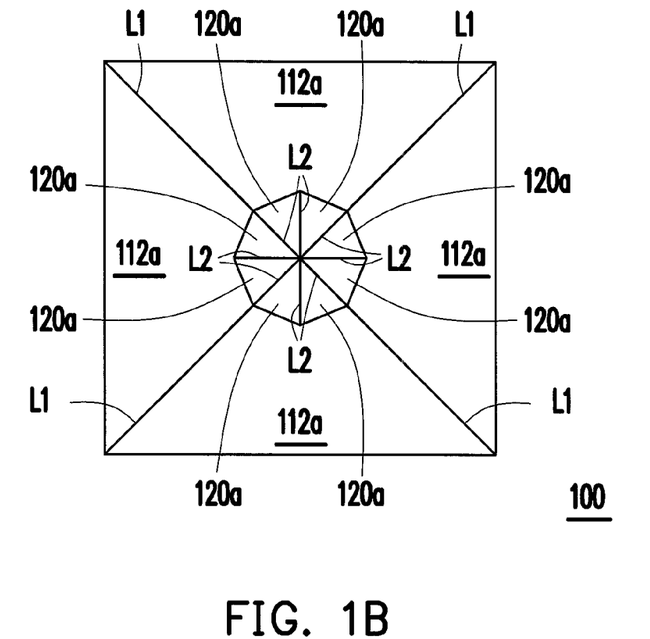
FIG. 1B is a top view of the multiple-reflection structure according to the first embodiment of the present application.
Figure 1C:
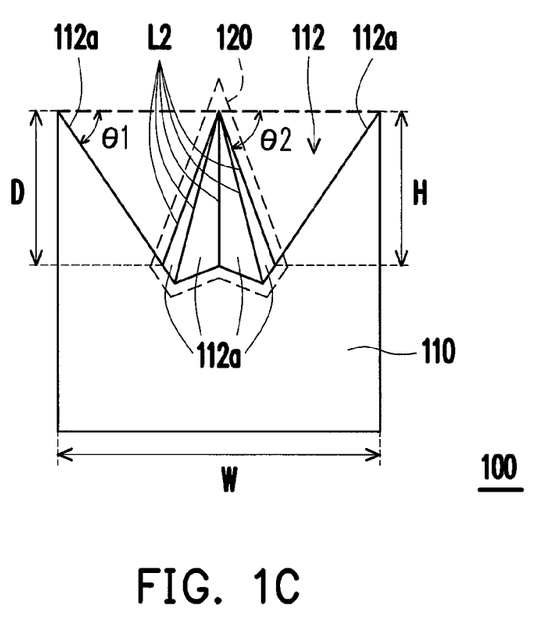
FIG. 1C is a cross-sectional view of a multiple-reflection structure according to the first embodiment of the present application.

FIG. 1A is a perspective view of a multiple-reflection structure according to the first embodiment of the present application. FIG. 1B is a top view of the multiple-reflection structure according to the first embodiment of the present application. FIG. 1C is a cross-sectional view of a multiple-reflection structure according to the first embodiment of the present application. Referring to FIG. 1A through FIG. 1C, the multi-reflection structure 100 of the present embodiment includes a substrate 110 and at least one pyramid 120. The substrate 110 includes an inversed pyramid shaped recess 112 having at least three first reflection sidewalls 112a. The pyramid 120 is disposed on the substrate 110 and is located in the inversed pyramid shaped recess 112. The pyramid 120 has at least three second reflection sidewalls 120a, wherein a normal NL2 of each of the second reflection sidewalls 120a and a normal NL1 of each of the first reflection sidewalls 112a are not located in the same plane. In this embodiment, the quantity of the inversed pyramid shaped recess 112 may be plural, the quantity of the pyramid 120 may be plural, and the quantity of the inversed pyramid shaped recess 112 is the same as the quantity of the pyramid 120. For example, the plurality of inversed pyramid shaped recesses 112 are arranged in array on a light-incident surface 110a of the substrate 110.

In this embodiment, the substrate 110 is, for example, a silicon substrate, a plastic substrate, a glass substrate, a quartz substrate or a metal substrate. The substrate 110 and the pyramid 120 are of the same material. Take the silicon substrate as an example, the inversed pyramid shaped recess 112 and the pyramid 120 are formed by an anisotropic etching process. The etchant used in the anisotropic etching process is, for example, a water solution of KOH or a water solution of tetra methyl ammonium hydroxide (TMAH). The composition of etchant, the concentration of etchant and the process time of the anisotropic etching process can be properly modified by one ordinary skilled in the art. Accordingly, the composition of etchant, the concentration of etchant and the process time of the anisotropic etching process are not limited in the present application. Further, the inversed pyramid shaped recess 112 and the pyramid 120 on the silicon substrate can also be fabricated by thermo-compression or UV curing. Take the plastic substrate as an example, the inversed pyramid shaped recess 112 and the pyramid 120 thereon can be fabricated by molding process or stamping process. Take the glass, quartz or metal substrate as an example, the inversed pyramid shaped recess 112 and the pyramid 120 thereon can be fabricated by etching process or stamping process.

As shown in FIG. 1A through FIG. 1C, the quantity of the first reflection sidewalls 112a is 4, the quantity of the second reflection sidewalls 120a is 8, wherein each of the first reflection sidewalls 112a is a flat surface, and each of the second reflection sidewalls 120a is a flat surface. It is noted that the quantity of the first reflection sidewalls 112a and the quantity of the second reflection sidewalls 120a are not limited in the application. In other words, the quantity of the first reflection sidewalls 112a is N1 (N1 is an integral greater than or equal to 3), and the quantity of the second reflection sidewalls 120a is N2 (N2 is an integral greater than or equal to 3). The relationship of N1 and N2 is not limited in this embodiment. Base on actual requirements, N1 may be smaller than N2. In another embodiment of the present application, N1 may be equal to or greater than N2.

In this embodiment, each one of the four first reflection sidewalls 112a has substantially the same area, and each one of the eight second reflection sidewalls 120a has substantially the same area. In other words, the pyramid 120 has regular polygonal bottom surface. It is noted that the area of each first reflection sidewalls 112a does not required to be the same as the area of each second reflection sidewalls 120a.

Figure 2A:
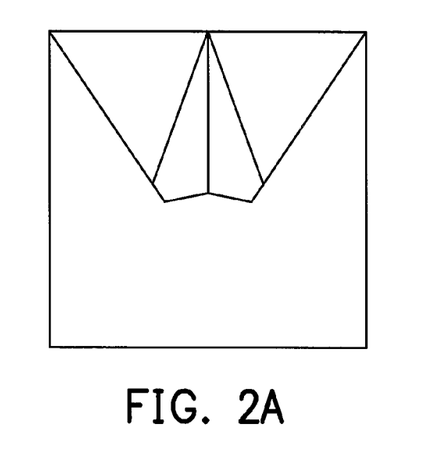
FIG. 2A through FIG. 2E are top views and cross-sectional views of different multiple-reflection structures according to the first embodiment of the present application.
Figure 2B:
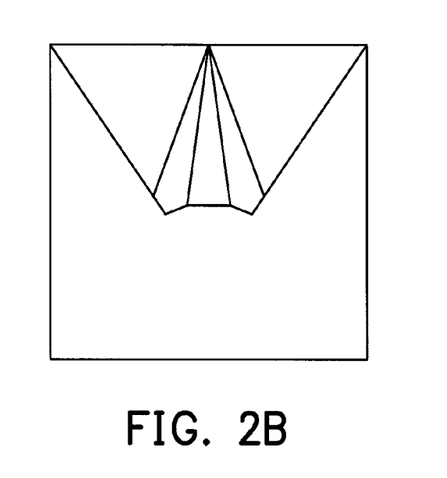
Figure 2C:
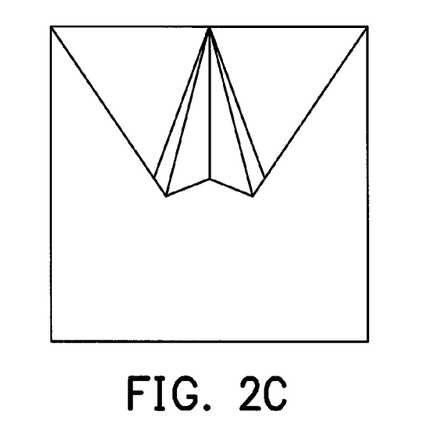
Figure 2D:
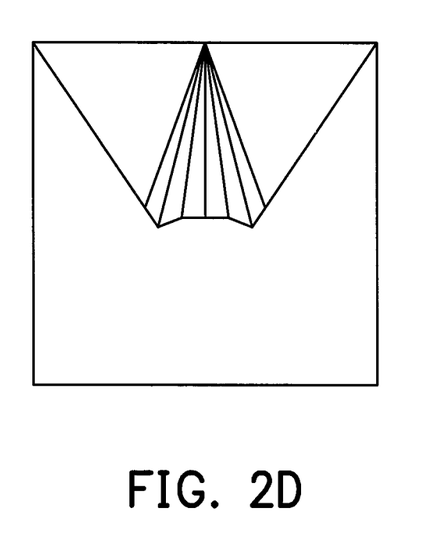
Figure 2E:
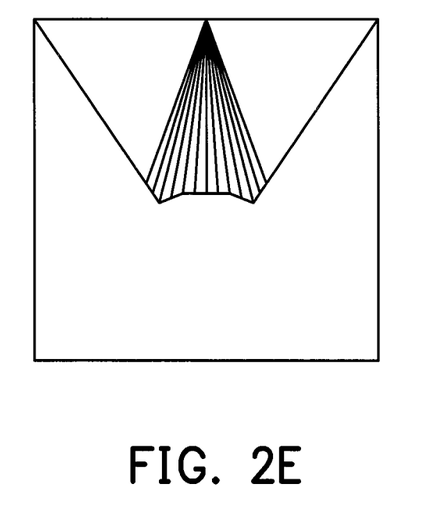

For example, when the quantity of the first reflection sidewalls 112a is 4, the quantity of the second reflection sidewalls 120a may be 4, 6, 8, 16 or 32, as shown in FIG. 2A through FIG. 2E. When the quantity of the first reflection sidewalls 112a and the quantity of the second reflection sidewalls 120a are the same (i.e. N1=N2), adjoining lines L1 between any two adjacent first reflection sidewalls 112a are not aligned with the crest lines L2 between any two adjacent second reflection sidewalls 120a, as shown in FIG. 2A. When N1<N2 and N2 is not an integral multiple of N2, each of the adjoining lines L1 is not aligned with any one of the crest lines L2, as shown in FIG. 2B. When N1<N2 and N2 is an integral multiple of N2, parts of the adjoining lines L1 are aligned with the crest lines L2, and the rest of the adjoining lines L1 are not aligned with the crest lines L2, as shown in FIG. 2C through FIG. 2E.

In this embodiment, with respect to the light-incident surface 110a, each of the first reflection sidewalls 112a has an inclined angle $\theta 1$, and $45°<\theta 1 \leq 90°$. For example, the aforesaid inclined angle $\theta 1$ is about 54.7°. In addition, with respect to the light-incident surface 110a, each of the second reflection sidewalls 120a has an inclined angle $\theta 1$, and $45°<\theta 2 \leq 90°$. For example, the aforesaid inclined angle $\theta 2$ is about 71.4°. It is noted that the inclined angle $\theta 1$ is not required to be identical with the inclined angle $\theta 2$. One ordinary skilled in the art may modify the inclined angle $\theta 1$ and the inclined angle $\theta 2$ according to the incident angle of light.

Please refer to FIG. 1C, the height H of the pyramid 120 this embodiment may be smaller than or substantially equal to the depth D of the inversed pyramid shaped recess 112. For example, the height H of the pyramid 120 ranges from 0.05 micrometer to 500 micrometers, and the depth D of the inversed pyramid shaped recess 112 ranges from 0.05 micrometer to 500 micrometers. Further, the maximum width W of the inversed pyramid shaped recess 112 ranges from 0.1 micrometer to 1000 micrometers.

When the quantity of the first reflection sidewalls 112a is 4, the quantity of the second reflection sidewalls 120a is 8, the inclined angle $\theta 1$ is about 54.7°, and the inclined angle $\theta 2$ is about 71.4°, approximately 44% of light is twice reflected, approximately 47% of light is reflected three times, and approximately 9% of light is reflected four times. Accordingly, an overall reflectivity of the multi-reflection structure 100 of this embodiment can be reduced to about 5%. Compared with reflectivity (about 10%) of the prior art (U.S. Pat.

No. 7,368,655), the multi-reflection structure 100 of this embodiment can effectively lower surface reflection issue.

Second Embodiment

Figure 3A:
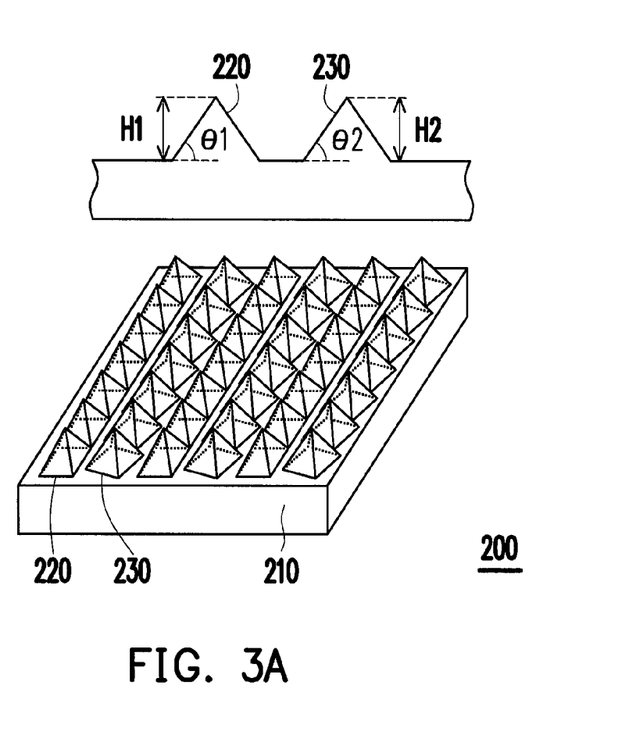
FIG. 3A and FIG. 3B are schematic views of a multiple-reflection structure according to the second embodiment of the present application.
Figure 3B:
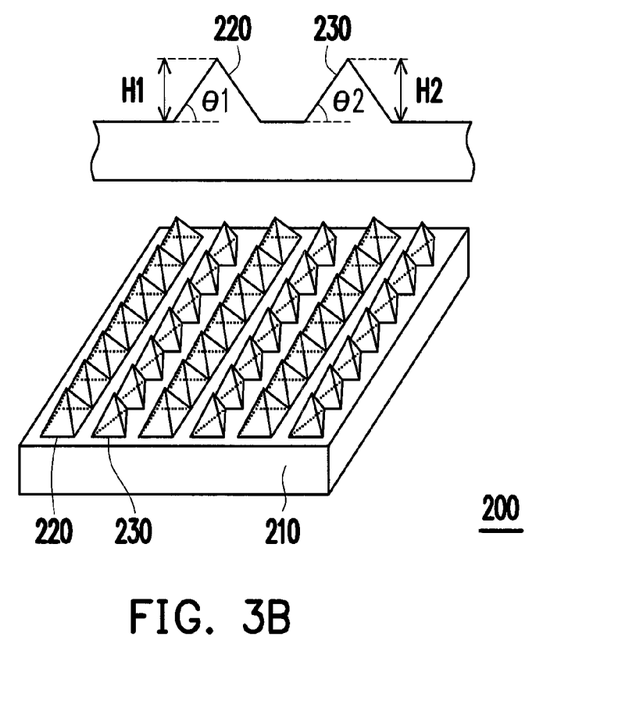

FIG. 3A and FIG. 3B are schematic views of a multiple-reflection structure according to the second embodiment of the present application. Referring to FIG. 3A through FIG. 3B, the multi-reflection structure 200 of this embodiment includes a substrate 210, at least one first pyramid 220 and at least one second pyramid 230. The first pyramid 220 is disposed on the substrate 210 and has at least three first reflection sidewalls 222. The second pyramid 230 is disposed on the substrate 210 and has at least three second reflection sidewalls 232, wherein a normal NL2 of each of the second reflection sidewalls 323 and a normal NL1 of each of the first reflection sidewalls 222 are not located in the same plane.

In this embodiment, the substrate 210 is, for example, a silicon substrate, a plastic substrate, a glass substrate, a quartz substrate or a metal substrate. The substrate 210, the first pyramid 220 and the second pyramid 230 are of the same material. Take the silicon substrate as an example, the first pyramid 220 and the second pyramid 230 are formed by an anisotropic etching process. The etchant used in the anisotropic etching process is, for example, a water solution of KOH or a water solution of tetra methyl ammonium hydroxide (TMAH). The composition of etchant, the concentration of etchant and the process time of the anisotropic etching process can be properly modified by one ordinary skilled in the art. Accordingly, the composition of etchant, the concentration of etchant and the process time of the anisotropic etching process are not limited in the present application. Further, the first pyramid 220 and the second pyramid 230 on the silicon substrate can also be fabricated by thermo-compression or UV curing. Take the plastic substrate as an example, the first pyramid 220 and the second pyramid 230 thereon can be fabricated by molding process or stamping process. Take the glass, quartz or metal substrate as an example, the first pyramid 220 and the second pyramid 230 thereon can be fabricated by etching process or stamping process.

As shown in FIG. 3A, the quantity of the first reflection sidewalls 222 is 4, the quantity of the second reflection sidewalls 232 is 4, wherein each border of the bottom surface the first pyramid 220 is not parallel with any one border of the bottom surface the second pyramid 230. In addition, each of the first reflection sidewalls 222 is a flat surface, and each of the second reflection sidewalls 232 is a flat surface.

As shown in FIG. 3B, the quantity of the first reflection sidewalls 222 is 4, the quantity of the second reflection sidewalls 232 is 3, wherein each of the first reflection sidewalls 222 is a flat surface, and each of the second reflection sidewalls 232 is a flat surface. It is noted that the quantity of the first reflection sidewalls 222 and the quantity of the second reflection sidewalls 232 are not limited in the application. In other words, the quantity of the first reflection sidewalls 222 is N1 (N1 is an integral greater than or equal to 3), and the quantity of the second reflection sidewalls 232 is N2 (N2 is an integral greater than or equal to 3). The relationship of N1 and N2 is not limited in this embodiment. Base on actual requirements, N1 may be smaller than, equal to or greater than N2.

In this embodiment, each one of the four first reflection sidewalls 222 has substantially the same area, and each one of the second reflection sidewalls 232 has substantially the same area. In other words, the first pyramid 220 has regular polygonal bottom surface, and the second pyramid 230 has regular polygonal bottom surface. It is noted that the area of each first reflection sidewalls 222 does not required to be the same as the area of each second reflection sidewalls 232.

In this embodiment, with respect to the substrate 210, each of the first reflection sidewalls 222 has an inclined angle θ1, and 45°<θ1≤90°. For example, the aforesaid inclined angle θ1 is about 54.7°. In addition, with respect to the substrate 210, each of the second reflection sidewalls 232 has an inclined angle θ1, and 45°<θ2≤90°. For example, the aforesaid inclined angle θ2 is about 54.7°. It is noted that the inclined angle θ1 is not required to be identical with the inclined angle θ2. One ordinary skilled in the art may modify the inclined angle θ1 and the inclined angle θ2 according to the incident angle of light.

In the present embodiment, the height H1 of the first pyramid 220 may be substantially equal to height H2 of the second pyramid 230. For example, the height H1 of the first pyramid 220 ranges from 0.05 micrometer to 500 micrometers, and the height H2 of the second pyramid 230 ranges from 0.05 micrometer to 500 micrometers.

The Third Embodiment

Figure 4:
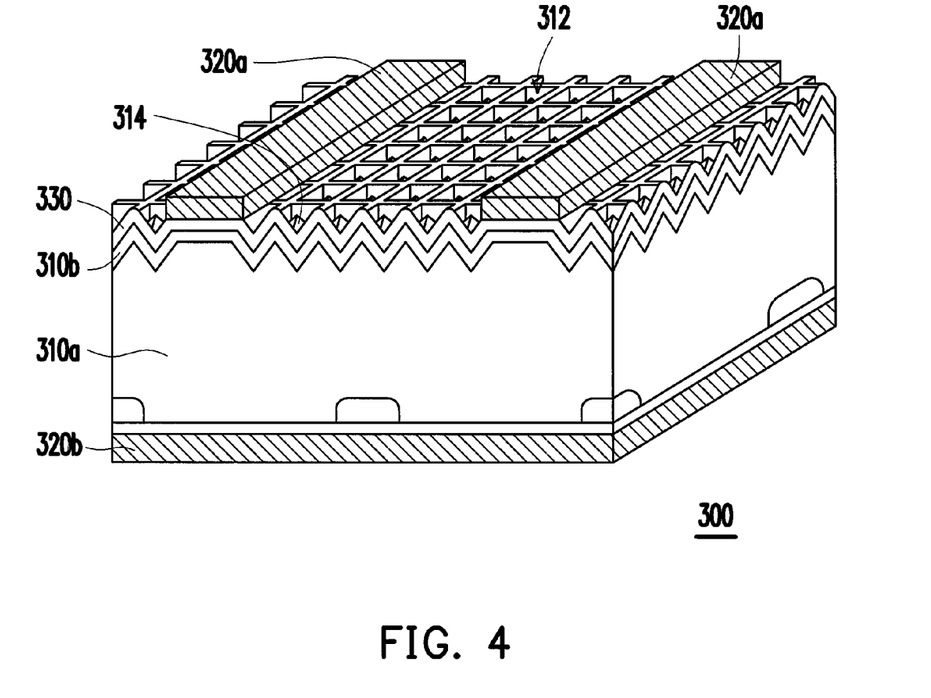
FIG. 4 is a schematic view of a photo-electric device according to the third embodiment of the present invention.

FIG. 4 is a schematic view of a photo-electric device according to the third embodiment of the present invention. Referring to FIG. 4, the photo-electric device 300 of this embodiment includes a photoelectric conversion layer 310 and a plurality of electrodes 320a, 320b. The photoelectric conversion layer 310 includes a plurality of inversed pyramid shaped recesses 312 and a plurality of a pyramids 314, wherein each of the inversed pyramid shaped recesses 312 has at least three first reflection sidewalls 312a, each of the pyramids 314 is located in one of the inversed pyramid shaped recesses 312 respectively, each of the pyramids 314 has at least three second reflection sidewalls 314a, and a normal NL2 of each of the second reflection sidewalls 314a and a normal NL1 of each of the first reflection sidewalls 312a are not located in the same plane. Furthermore, the electrodes 320a and 320b are electrically connected to the photoelectric conversion layer 310.

Since the inversed pyramid shaped recesses 312 and the pyramids 314 of this embodiment are the same as the inversed pyramid shaped recesses 112 and the pyramids 120, description regarding to the inversed pyramid shaped recesses 312 and the pyramids 314 is omitted.

For example, the material of the photoelectric conversion layer 310 is mono-crystalline silicon, poly-crystalline silicon, amorphous silicon, CdTe, CIS, CIGS, Ge, AlInGaAs or active materials of the polymer solar cell.

In this embodiment, the photoelectric conversion layer 310 includes a p-type doped silicon substrate 310a, a n-type lightly doped region 310b, a plurality of n-type heavily doped region 310c electrically connected to the electrode 320a, and a plurality of p-type heavily doped region 310c electrically connected to the electrode 320b. The photoelectric conversion layer 310 is capable of converting light into electric power. In other words, the photo-electric device 300 of this embodiment is a solar cell. Though the photoelectric conversion layer 310 shown in FIG. 4 is illustrated here, the photoelectric conversion layer 310 can be modified by one ordinary skilled in the art. In other words, different types of photoelectric conversion layers can be used in the present application.

As shown in FIG. 4, the photo-electric device 300 of this embodiment may further include an anti-reflection coating 330 that covers the inversed pyramid shaped recesses 312 and the pyramids 314. For example, the material of the anti-reflection coating 330 is silicon nitride (SiNx), silicon oxide (SiO$_2$), ZnS, TiO$_2$, ZnO, SnO$_2$, MgF$_2$, CaF$_2$, Al$_2$O$_3$, LiF, NaF, mesoporous silicon, mesoporous silica. Of course, the anti-reflection coating 330 may be formed by stacking the above-mentioned materials.

Experimental Example

Figure 5:
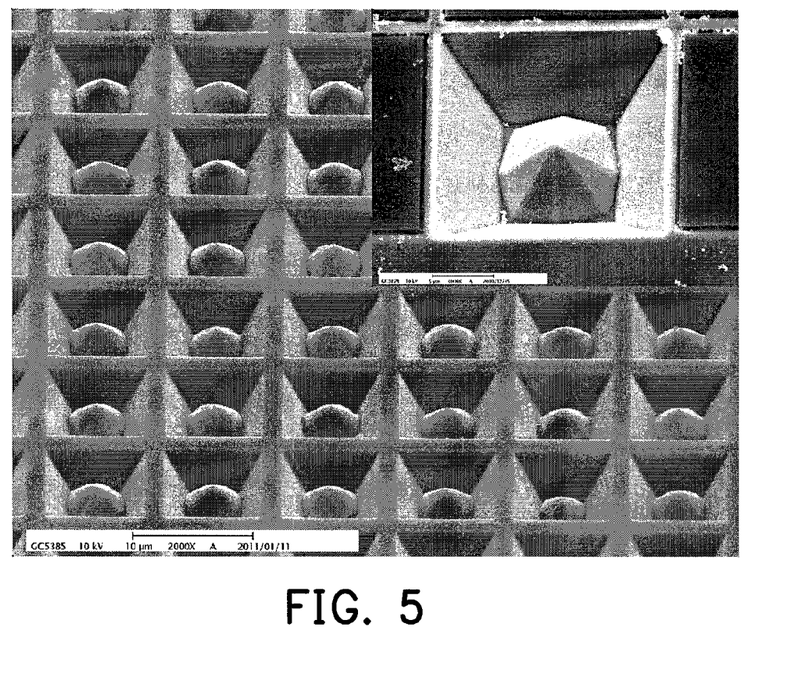
FIG. 5 is a SEM view of the multiple-reflection structure as depicted in FIG. 1A.

FIG. 5 is a SEM view of the multiple-reflection structure as depicted in FIG. 1A. Referring to FIG. 5 and FIG. 1A, in this embodiment, the inversed pyramid shaped recess 112 has four first reflection sidewalls 112a, the pyramid 120 has eight second reflection sidewalls 120a, the inclined angle θ1 is about 54.7° (as shown in FIG. 1C), and the inclined angle θ2 is about 71.4° (as shown in FIG. 1C).

Figure 6:
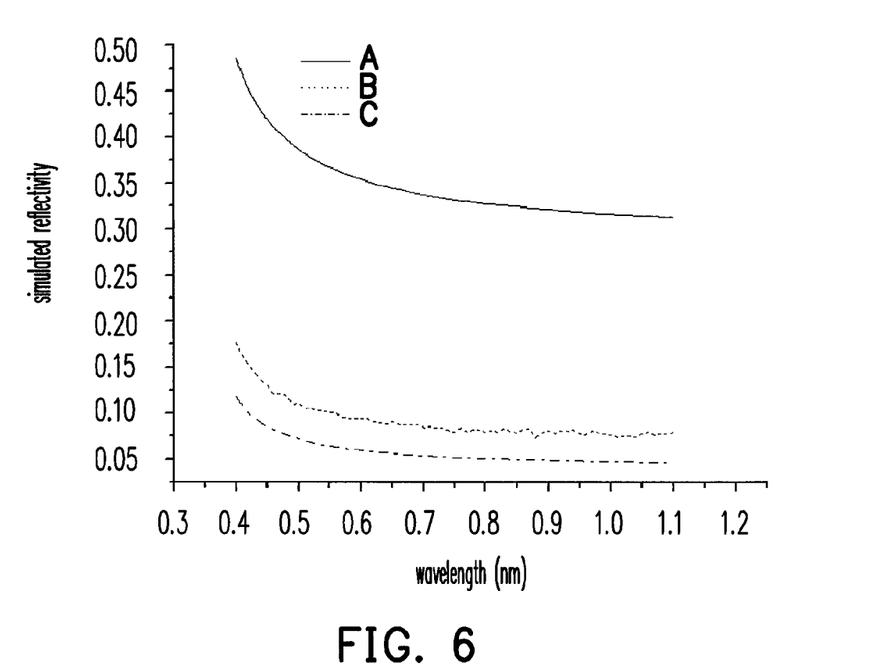
FIG. 6 is a simulation result regarding to reflectivity of the multiple-reflection structure according to the first embodiment of the present application.

Referring to FIG. 6, curve A represents simulated reflectivity of a substrate having a flat surface, curve B represents simulated reflectivity of a substrate having inversed pyramid shaped recesses, and curve C represents simulated reflectivity of a substrate having inversed pyramid shaped recesses and pyramids. As shown in FIG. 6, the simulated reflectivity of the first embodiment (curve C) is lower than the other two (curves A and B). Accordingly, surface reflection can be reduced by this application.

This application can be applied to displays, solid-state illumination devices, solar cells, optical films, and so on. Accordingly, surface reflection can be reduced and photo-electric conversion efficiency of the photo-electric devices.

Although the present invention has been disclosed above by the embodiments, they are not intended to limit the present invention. Anybody skilled in the art can make some modifications and alteration without departing from the spirit and scope of the present invention. Therefore, the protecting range of the present invention falls in the appended claims.

What is claimed is:

1. A multi-reflection structure, comprising:
    a substrate, comprising an inversed pyramid shaped recess having at least three first reflection sidewalls; and
    a pyramid, disposed on the substrate and located in the inversed pyramid shaped recess, the pyramid having at least three second reflection sidewalls, wherein none of the first reflection sidewalls and the second reflection sidewalls is located in a same plane.

2. The multi-reflection structure of claim 1, wherein the substrate is a glass substrate, a plastic substrate, a glass substrate, a quartz glass or a metal substrate.

3. The multi-reflection structure of claim 1, wherein a number of the first reflection sidewalls is N1, a number of the second reflection sidewalls is N2, and N1<N2.

4. The multi-reflection structure of claim 1, wherein each of the first reflection sidewalls is a flat surface, and each of the second reflection sidewalls is a flat surface.

5. The multi-reflection structure of claim 1, wherein the substrate has a light-incident surface, the inversed pyramid shaped recess is located on the light-incident surface, with respect to the light-incident surface, each of the first reflection sidewalls has an inclined angle θ1, and 45°<θ1≤90°.

6. The multi-reflection structure of claim 5, wherein the inclined angle θ1 is about 54.7°.

7. The multi-reflection structure of claim 5, wherein with respect to the light-incident surface, each of the first reflection sidewalls has an inclined angle θ2, and 45°<θ2≤90°.

8. The multi-reflection structure of claim 7, wherein the inclined angle θ2 is about 71.4°.

9. The multi-reflection structure of claim 1, wherein a height of the pyramid is smaller than or substantially equal to a depth of the inversed pyramid shaped recess.

10. The multi-reflection structure of claim 9, wherein the height of the pyramid ranges from 0.05 micrometer to 500 micrometers, and the depth of the inversed pyramid shaped recess ranges from 0.05 micrometer to 500 micrometers.

11. The multi-reflection structure of claim 1, wherein a maximum width of the inversed pyramid shaped recess ranges from 0.1 micrometer to 1000 micrometers.

12. The multi-reflection structure of claim 1, wherein the substrate and the pyramid are of the same material.

13. A multi-reflection structure, comprising:
    a substrate;
    at least one first pyramid, disposed on the substrate, wherein the first pyramid has at least three first reflection sidewalls; and
    at least one second pyramid, disposed on the substrate, wherein the second pyramid has at least three second reflection sidewalls, wherein none of the first reflection sidewalls and the second reflection sidewalls is located in a same plane.

14. The multi-reflection structure of claim 13, wherein the substrate is a glass substrate, a plastic substrate, a glass substrate, a quartz glass or a metal substrate.

15. The multi-reflection structure of claim 13, wherein a number of the first reflection sidewalls of each of the first pyramids is N1, and a number of the second reflection sidewalls of each of the second pyramids is N2, and N1<N2.

16. The multi-reflection structure of claim 13, wherein each of the first reflection sidewalls is a flat surface, and each of the second reflection sidewalls is a flat surface.

17. The multi-reflection structure of claim 13, wherein the substrate, the first pyramid and the second pyramid are of the same material.

* * * * *